(12) United States Patent
Hsieh et al.

(10) Patent No.: US 9,442,391 B2
(45) Date of Patent: Sep. 13, 2016

(54) OVERLAY SAMPLING METHODOLOGY

(71) Applicant: Taiwan Semiconductor Manufacturing Co., Ltd., Hsin-Chu (TW)

(72) Inventors: Han-Ming Hsieh, Hsin Chu (TW); Li-Shiuan Chen, Kaohsiung (TW); Chung-Hao Chang, Hsinchu (TW); Li-Kong Turn, Taichung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 604 days.

(21) Appl. No.: 13/942,810

(22) Filed: Jul. 16, 2013

(65) Prior Publication Data

US 2014/0278213 A1  Sep. 18, 2014

Related U.S. Application Data (60) Provisional application No. 61/777,332, filed on Mar. 12, 2013.

(51) Int. Cl.
| | | |
|---|---|---|
| *H01L 21/68* | (2006.01) | |
| *G01B 11/14* | (2006.01) | |
| *G06F 17/40* | (2006.01) | |
| *G06F 19/00* | (2011.01) | |
| *G03F 7/20* | (2006.01) | |

(52) U.S. Cl.
CPC ........... *G03F 7/70633* (2013.01); *G01B 11/14* (2013.01); *H01L 21/68* (2013.01); *G06F 17/40* (2013.01); *G06F 19/00* (2013.01)

(58) Field of Classification Search
None
See application file for complete search history.

(56) References Cited

U.S. PATENT DOCUMENTS

| 6,128,070 A | 10/2000 | Peng |
|---|---|---|
| 2007/0077666 A1 | 4/2007 | Sogawa |
| 2008/0286885 A1 | 11/2008 | Izikson et al. |

FOREIGN PATENT DOCUMENTS

| KR | 1020070092426 A | 9/2007 |
|---|---|---|
| KR | 20090067139 A | 6/2009 |
| KR | 20100017274 A | 2/2010 |
| TW | 480586 | 3/2002 |
| TW | 200723356 | 6/2007 |
| WO | 2008025492 A1 | 3/2008 |
| WO | 2013055710 A1 | 4/2013 |

OTHER PUBLICATIONS

English Translation of Korean Office Action dated Mar. 31, 2015 for copending Korean Application No. 10-2013-0146132.

*Primary Examiner* — Edward Cosimano
(74) *Attorney, Agent, or Firm* — Eschweiler & Associates, LLC (57) ABSTRACT

One embodiment relates to a method to achieve enhanced overlay control while maintaining manufacturing throughput for a fabrication process. Locations of a plurality of alignment structures on a wafer comprising a plurality of reticle fields are determined with a layout tool to define a layout-based wafer map. The topography of the wafer is then measured as a function of wafer position by a surface measuring tool. The layout-based wafer map is then projected onto the measured wafer topography to define a modeled wafer map. A subset of alignment structure locations are measured with an alignment tool in an in-line fabrication flow so as not to delay subsequent fabrication steps. Disagreement between the measured alignment structure locations and modeled alignment structure locations is then minimized mathematically to enhance overlay control while maintaining manufacturing throughput.

20 Claims, 9 Drawing Sheets

OVERLAY SAMPLING METHODOLOGY

REFERENCE TO RELATED APPLICATIONS

This application is a Non-Provisional application claiming priority to U.S. expired Provisional Patent Application Ser. No. 61/777,332 filed Mar. 12, 2013 entitled "OVERLAY SAMPLING METHODOLOGY" which is hereby incorporated by reference.

BACKGROUND

The following disclosure relates to overlay metrology and methods to achieve enhanced overlay control between two or more alignment events while maintaining manufacturing throughput for semiconductor fabrication process.

DETAILED DESCRIPTION

The present disclosure will now be described with reference to the drawings wherein like reference numerals are used to refer to like elements throughout, and wherein the illustrated structures are not necessarily drawn to scale. It will be appreciated that this detailed description and the corresponding figures do not limit the scope of the present disclosure in any way, and that the detailed description and figures merely provide a few examples to illustrate some ways in which the inventive concepts can manifest themselves.

Silicon wafers are manufactured in a sequence of successive lithography steps comprising mask alignment, exposure, photoresist development, layer etch, and epitaxial layer growth to form a pattern which defines device structures and interconnects within an integrated circuit (IC). To guarantee robust mask alignment, dedicated alignment structures are placed within physical layout data of the IC, and are utilized by an in-line alignment tool within a semiconductor manufacturing flow to achieve overlay (OVL) control during mask alignment. A patterned wafer consists of a plurality of ICs arranged into a periodic array or reticle fields, wherein each reticle field is patterned by a step-and-repeat tool configured align a patterned mask to an individual reticle field based upon a wafer map of alignment structure locations obtained from the physical layout data of the IC. Yield and device performance rely upon robust OVL control between two or more mask alignment steps when forming layers of a device. However, to achieve manufacturing throughput for a semiconductor fabrication process, a subset of alignment structure locations are sampled such that not all reticle fields are aligned independently by the step-and-repeat tool, thus degrading OVL control. In addition, effects such as thermal cycling of the wafer during the aforementioned fabrication steps can distort an ideally flat wafer surface and form wafer topologies which may degrade OVL control.

Accordingly, the present disclosure relates to a method and system to achieve enhanced overlay control while maintaining manufacturing throughput for a fabrication process. Locations of a plurality of alignment structures on a wafer comprising a plurality of reticle fields are determined with a layout tool to define a layout-based wafer map. The topography of the wafer is then measured as a function of wafer position by a surface measuring tool. The layout-based wafer map is then projected onto the measured wafer topography to define a modeled wafer map. A subset of alignment structure locations are measured with an alignment tool in an in-line fabrication flow so as not to delay subsequent fabrication steps. Disagreement between the measured alignment structure locations and modeled alignment structure locations is then minimized mathematically to enhance overlay control while maintaining manufacturing throughput.

Figure 1A:
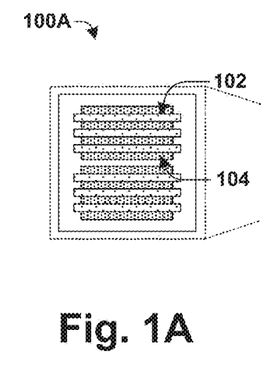
FIGS. 1A-1E illustrate some embodiments of a hierarchical layout assembly of multiple integrated chips (ICs) into a wafer-level reticle field and layout-based wafer map.
Figure 1B:
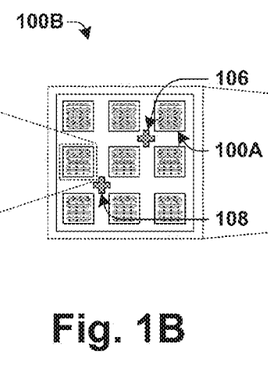

FIG. 1A illustrates some embodiments of a layout view 100A of an integrated circuit (IC) comprising first layout topologies 102 (e.g., poly-silicon gate shapes) and second layout topologies 104 (e.g., source/drain diffusion shapes). In some embodiments, the layout view 100A of the IC comprises a plurality of layout topologies in an industry-standard layout format such as GDSII or OASIS, which will be patterned onto a silicon (Si) or silicon-on-insulator (SOI) wafer in an in-line fabrication flow within a semiconductor fabrication plant, or "fab." FIG. 1B illustrates some embodiments of a frame 100B comprising a plurality of layout views 100A (i.e., nine identical copies of the layout view 100A periodically arranged), wherein a first alignment structure 106 for x-axis alignment and a second alignment structure 108 for y-axis alignment have been added in "white space" (i.e., unused wafer area) between the plurality of layout views 100A, to aid in mask alignment during in-line fabrication. For the embodiments of FIG. 1B, two alignment structures are utilized for 2-dimensional (2D) alignment. However, in other embodiments an arbitrary number may be used.

Figure 1C:
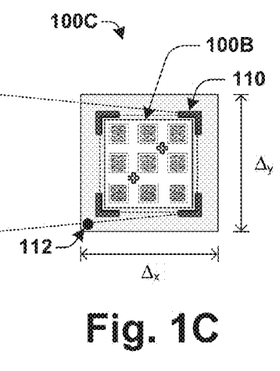
Figure 1D:
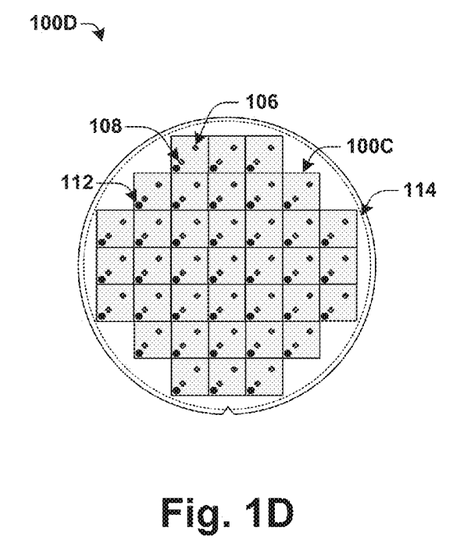

FIG. 1C illustrates some embodiments of a reticle field 100C comprising the frame 100B, wherein additional metrology structures 110 have been added for additional overlay (OVL) control during a mask alignment event, to monitor critical dimension (CD) variation of layout topologies across a plurality of reticle fields disposed on the wafer surface, etc. An origin position 112 of the reticle field 100C is also shown. FIG. 1D illustrates some embodiments of a wafer 100D (e.g., Si or SOI), whereupon a periodic pattern 114 of reticle fields 100C are arranged (i.e., 37 reticles fields 100C for the embodiments of FIG. 1D, but in general can be any number corresponding to a periodic arrangement of reticle fields 100C). In some embodiments, the wafer may comprise a 300 mm wafer or a 450 mm wafer for manufacturing within the fab, wherein each reticle field 100C is exposed individually to form the pattern. In some embodiments, a step-and-repeat tool is used to align a photomask with the origin position 112 of a respective reticle field 100C, and expose to a light source to form a pattern within the respective reticle field 100C before "stepping" to a next periodic location of a next reticle field 100C. As such, a layout-based wafer map 100E as depicted in the embodiments of FIG. 1E may be utilized by the step-and-repeat tool to locate the origin positions 112 of all reticle fields 100C on a wafer.

Figure 1E:
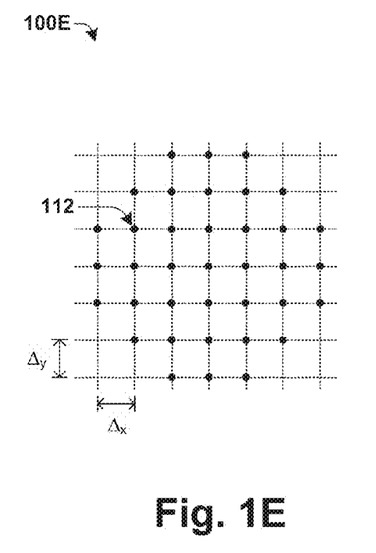
Figure 2A:
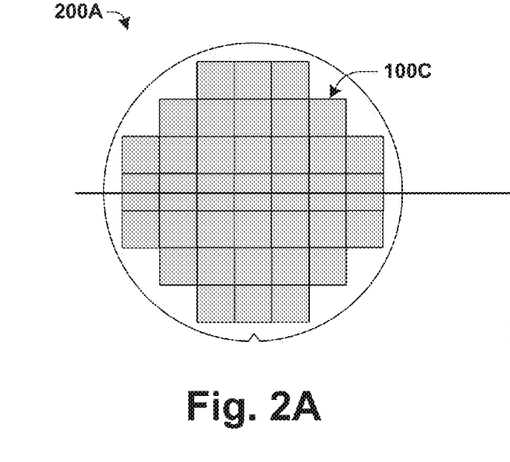
FIGS. 2A-2C illustrate cross-sections of some embodiments of ideal and real wafer topologies.
Figure 2B:
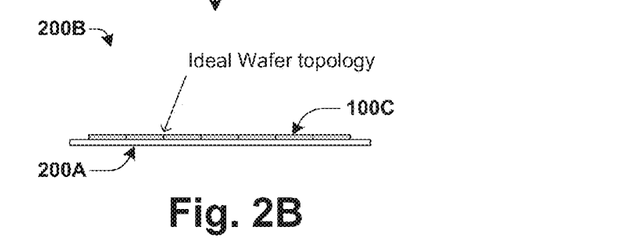
Figure 2C:
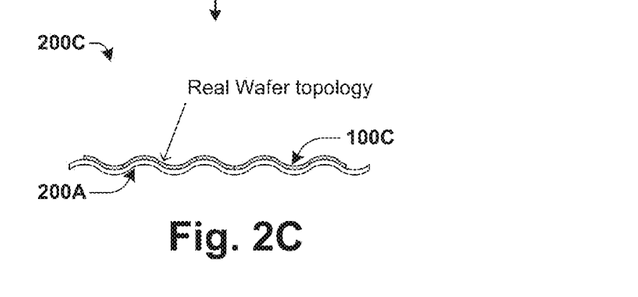

For the embodiments of FIG. 1E, the layout-based wafer map 100E comprises a perfect periodicity along the x-direction ($\Delta_x$) and along the y-direction ($\Delta_y$) such that a generalized step size of $n\Delta_x + m\Delta_y$ by the step-and-repeat tool will perfectly align the light source with any origin position 112 defined by the layout-based wafer map 100E (where n,m≤7 for the embodiments of FIGS. 1A-1E). In practice, topographical variations of the wafer 100D will distort the origin positions 112 from the locations defined by the layout-based wafer map 100E. FIGS. 2A-2C illustrate some embodiments of a wafer 200A shown in cross-section, wherein an ideal wafer topography 200B and a realistic wafer topography 200C are shown. Note that the periodic nature of the realistic wafer topography 200C cross-section is simply meant to imply that the surface topography if the wafer 200A is not flat, and not meant to imply that the realistic wafer topography 200C in general is periodic or repeated. In general the realistic wafer topography 200C may comprise any irregular 3D topography resulting from thermal effects such as thermal cycling of the wafer, mechanical effects such as chemical mechanical polishing (CMP) or etching, electromagnetic effects such as deformation due to an electric potential, or other process steps involving thermal cycling, etc.

For the purpose of subsequent discussion, one may consider the gridded origin positions 112 as the position of a single alignment structure located at the origin of each reticle field 100C. It will be appreciated that a single alignment structure (e.g., 106 or 108) repeated periodically within the plurality of reticle fields 100C periodically disposed on a surface of the wafer 100D will comprise the same x/y-periodicity as the origin positions 112 of the layout-based wafer map 100E. Moreover, it will further be appreciated that two alignment structures (e.g., 106 and 108) within the plurality of reticle fields 100C periodically disposed on a surface of the wafer 100D will comprise the same x/y-periodicity as two layout-based wafer maps 100E overlayed upon one-another with an offset vector equal to a vector defining a distance and direction between the first alignment structure 106 and the second alignment structure 108. Therefore, as it is appreciated that the preceding analysis may be extended to an arbitrary number of alignment structures per reticle, the origin position is sufficient to represent the alignment structure position in subsequent embodiments of this disclosure.

Figure 3A:
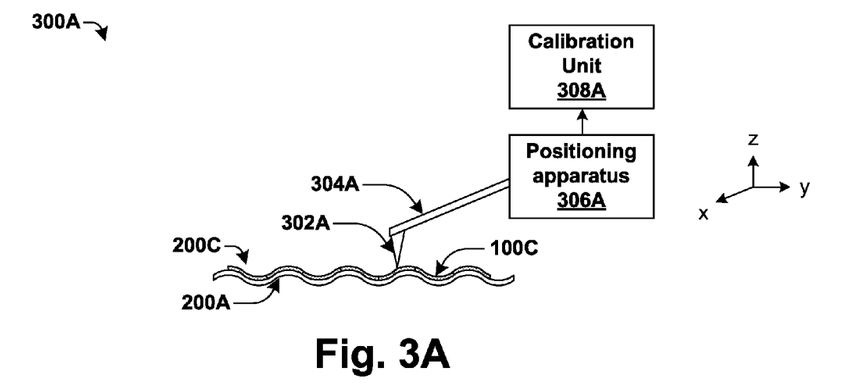
FIGS. 3A-3C illustrate some embodiments of wafer topography measurements.

FIG. 3A illustrates some embodiments of a physical measurement tool 300A configured to measure the surface topography of a wafer 200C. In some embodiments, the physical measurement tool comprises an Air Gauge Improved LEveling (AGILE) tool. In some embodiments, the physical measurement tool 300A comprises an air gauge 304A configured to discharge a gas locally onto a surface of a wafer 200C. The air gauge 304A further comprises a sensor 302A configured to detect a variation in a pressure of the gas as a function of position within a plane of the wafer 200C (i.e., the x-direction or y-direction). The physical measurement tool 300A further comprises a positioning apparatus 306A configured to move the air gauge 304A and sensor 302A across the surface of the wafer 200C. A calibration unit 308A is coupled to the positioning apparatus and configured to determine a height (Z) of the surface of the wafer 200C as a function of the variation in pressure. The calibration unit 308A is further configured to define the height as a function of position, Z(x,y). The physical measurement tool 300A does not utilize or recognize alignment structures, and measures the surface topography of the wafer 200C with a resolution that is greater than a resolution of the alignment structure location spacing (e.g., a resolution greater than $\Delta_x$ or $\Delta_y$ for a single "alignment structure" 112 per reticle field 100C).

Figure 3B:
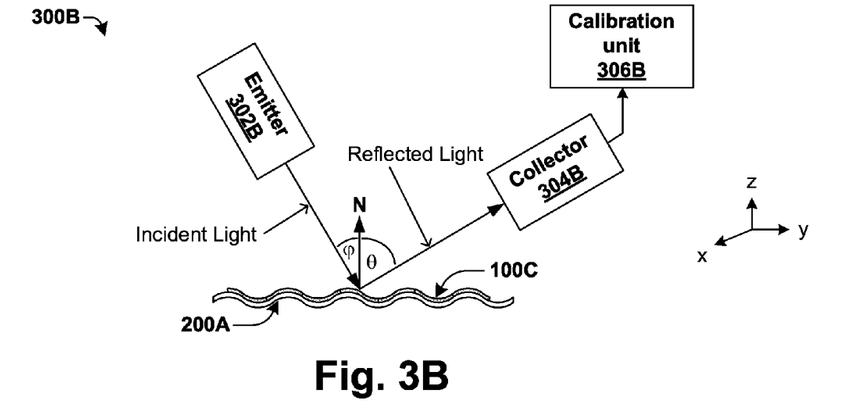
Figure 3C:
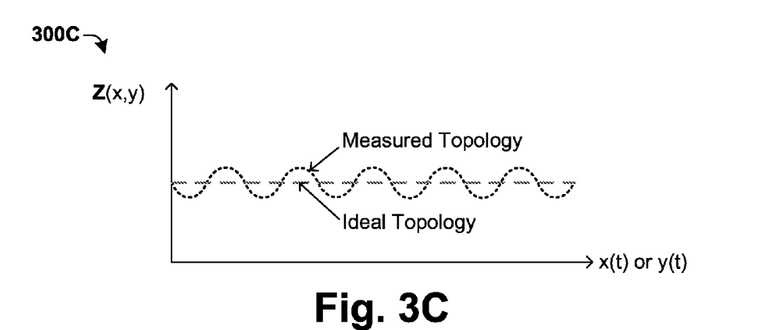

FIG. 3B illustrates some embodiments of an optical measurement tool 300B configured to measure the surface topography of the wafer 200C. The optical measurement tool 300B comprises an emitter 302B configured to emit a focused incident beam of radiation (e.g., light) to the surface of the wafer 200C at a first angle $\Phi$ with a normal vector N to the surface of the wafer 200C. The incident beam is reflected off the surface of the wafer 200C at a second angle $\theta$ to N, and is received by a collector 304B. A calibration unit 306B is coupled to the collector 304B and configured to determine the height of the surface of the wafer as a function of position Z(x,y) from the first angle $\Phi$ or the second angle $\theta$ with a resolution that is greater than a resolution of the alignment structure location spacing. FIG. 3C illustrates a graph 300C of some embodiments of a 1D surface topology measurement comprising a measured surface topography as a function of position Z(x,y) in accordance with the embodiments of FIGS. 3A-3B. A 2D surface topology measurement follows analogously.

Figure 4A:
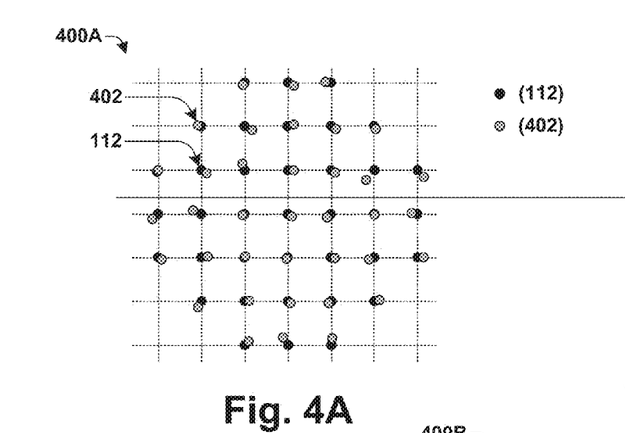
FIGS. 4A-4D illustrate some embodiments of projecting layout-based alignment structure locations from a layout-based wafer map onto a measured wafer topography to produce a modeled wafer map.
Figure 4B:
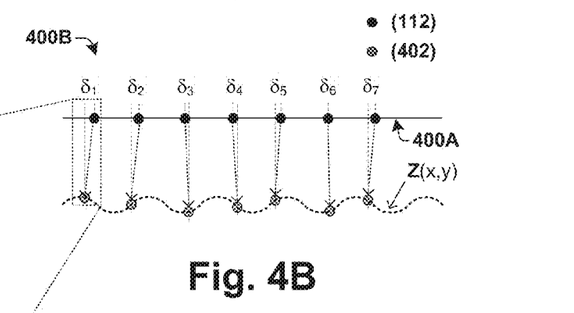
Figure 4C:
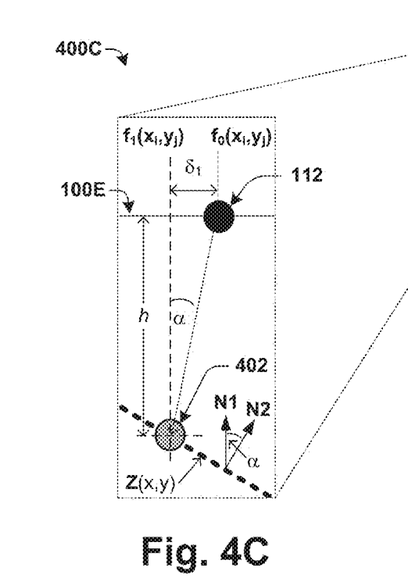
Figure 4D:
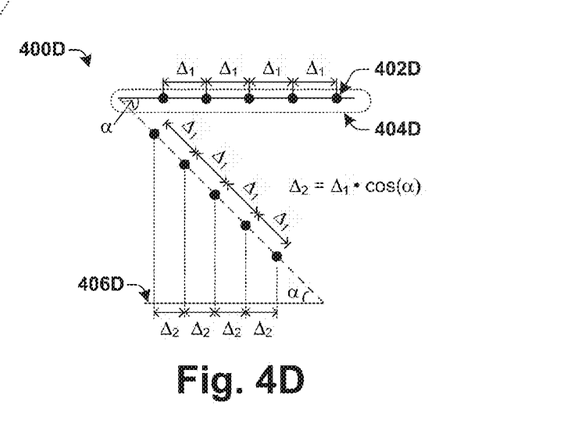

A variation in surface topology of a wafer can distort alignment structure locations from their ideal locations when aligning to a surface of the wafer. FIG. 4A illustrates some embodiments of a coordinate grid 400A, whereupon the origin positions 112 of the layout-based wafer map 100E corresponding to a flat surface topology reside. The coordinate grid 400A further comprises modeled alignment structure locations 402 which are derived from the measured surface topography Z(x,y) of a wafer. FIG. 4B illustrates a cross-sectional view 400B of the embodiments of coordinate grid 400A, wherein the modeled alignment structure locations 402 from the measured surface topography Z(x,y) are projected into a 2D plane of coordinate grid 400A. In some embodiments, the projection of the modeled alignment structure locations 402 into the 2D plane comprises mapping software. In some embodiments, projecting the the measured surface topography Z(x,y) onto the 2D plane comprises approximating the measured surface topography Z(x,y) as having negligible curvature in a local region. FIG. 4C illustrates some embodiments of an exploded view 400C of cross-sectional view 400B, wherein an ideal alignment structure location comprises the origin position 112 from the layout-based wafer map 100E of the embodiments of FIG. 1E. However, distortion of the wafer surface as modeled by the measured surface topography Z(x,y) moves the alignment structure location from its ideal position. Under the assumption that the measured surface topography Z(x,y) has negligible curvature in a local region of the origin position 112, the local region is defined as an approximate vicinity of the origin position 112 and a modeled alignment structure position determined from the linear projection of the measured surface topography Z(x,y) onto the 2D plane of coordinate grid 400A. With this assumption, the height h of the surface of the wafer 404 as modeled by the measured surface topography Z(x,y) at the origin position 112 $(x_i,y_j)$ is defined by $Z(x_i,y_j)=h$, and may be equated to an angle $\alpha$ between a first normal vector $N_1$ of a flat wafer surface (i.e., $N_1=Z$), and a second normal vector $N_2$ to the measured surface topography $Z(x,y)$ at the origin position 112 $(x_i,y_j)$. Therefore, a shift $\delta_1$ from the origin position 112 $(x_i,y_j)$ can be approximated as $\delta_1=h\cdot\tan(\alpha)$, and may further be approximated as $\delta_1\approx h\cdot\alpha$ for $\delta_1\ll h$. A resultant modeled wafer map $f_1(x_i,y_j)$ can be defined in terms of the layout-based wafer map $f_0(x_i,y_j)$ by:

$$f_1(x_i,y_j)=f_0(x_i,y_j)+\delta_1=f_0(x_i,y_j)+h\cdot\tan(\alpha)\approx f_0(x_i,y_j)+h\cdot\alpha. \quad (1)$$

For further clarity as to the assumptions utilized in the analysis of the embodiments of FIGS. 4A-4C, FIG. 4D illustrates a graph 400D of some embodiments of performing a linear projection of the local region onto a flat two-dimensional surface, wherein first locations of first grid points 402D of a linear array 404D are shown, and comprise an ideal periodic spacing of $\Delta_1$. The linear array 404D is oriented horizontally, and is analogous the cross-section of the layout-based wafer map 100E. To model topographical variation of the linear array 404D under an assumption that the surface topography has negligible curvature, the linear array 404D is rotated from its horizontal orientation by an angle $\alpha$. To model the positions of the first grid points 402D in a top-down view, a linear projection is performed of the linear array 404D onto a flat horizontal two-dimensional surface, resulting in second locations of the first grid points 402D and comprising a modeled periodic spacing of $\Delta_2=\Delta_1\cdot\cos(\alpha)$.

Figure 5A:
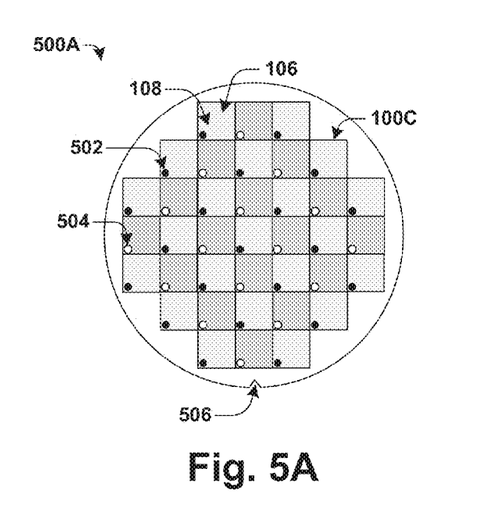
FIGS. 5A-5D illustrate some embodiments of in-line wafer alignment to a subset of alignment structures to produce a measured coordinate system.

FIG. 5A illustrates some embodiments of a wafer 500A subject to in-line mask alignment. After preparation for a patterning step (e.g., coating with photoresist) the wafer 500A is loaded onto a wafer stage of a step-and-repeat tool, wherein a course mask alignment step is performed. In some embodiments, the course alignment step comprises orienting the wafer notch 506, or by utilizing the metrology structures 110 shown in the embodiments of FIGS. 1C-1E. Subsequent to the course alignment, the wafer undergoes a fine alignment, wherein one or more alignment structures 502 or 504 are utilized. For the embodiments of FIG. 5A, 37 reticle fields 100C are periodically disposed on a surface of the wafer 500A. Other embodiments utilizing a wafer 500A comprising a diameter of 450 mm may comprise between approximately 50 and approximately 100 reticle fields 100C. To achieve optimal alignment, each alignment structure each reticle field 100C can be aligned to minimize OVL variation across the surface of the wafer 500. However, within an in-line fabrication flow under manufacturing throughput constraints, aligning to each alignment structure 502 or 504 compromises manufacturing throughput. As such, a subset of the alignment structures 502 are aligned. In some embodiments, approximately 30% (30 out of 100) alignment structures 502 and 504 are utilized by the step-and-repeat tool, thus sacrificing OVL quality for manufacturing throughput. For the embodiments of FIG. 5A, the subset of alignment structure locations 502 comprise a checkerboard pattern, wherein aliment structures 502 are measured in every other reticle field 100C.

Figure 5B:
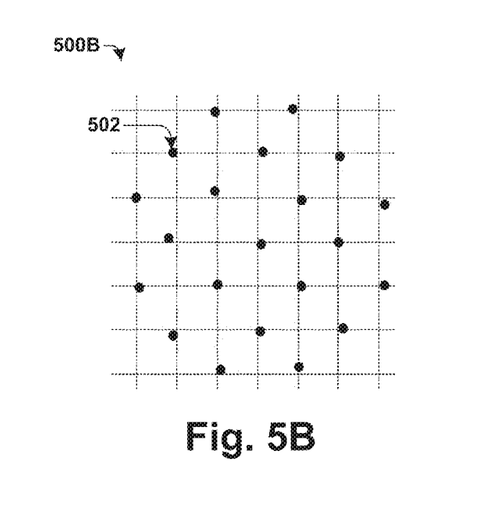
Figure 5C:
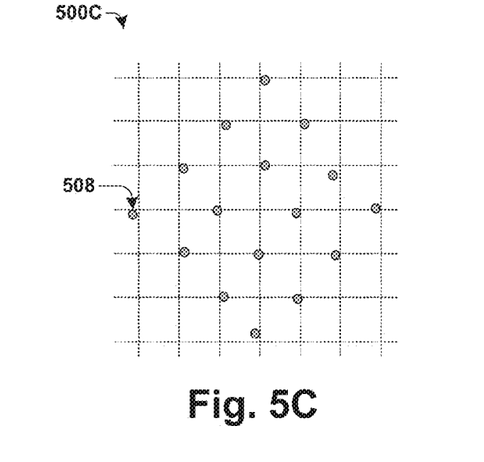
Figure 5D:
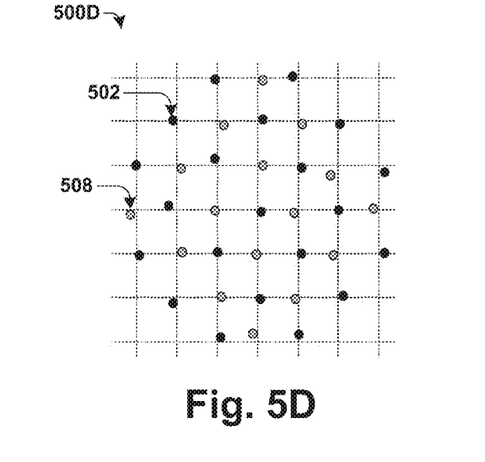

FIG. 5B illustrates some embodiments of a measured wafer map 500B, comprising the subset of alignment structures 502 measured in-line in the embodiments of FIG. 5A, placed on a coordinate grid. FIG. 5C Illustrates some embodiments of a modeled wafer map 500C comprising a subset of modeled alignment structure locations 508 produced in accordance with the embodiments of FIGS. 3A-3C and FIGS. 4A-4C. For the embodiments of FIG. 5A, 21 of 37 reticle fields 100C were measured in-line to produce the measured wafer map. The locations of alignment structures 504 in the remaining unsampled reticle fields 100C (i.e., those with alignment structures 504 in the embodiments of FIG. 5A) are determined from the modeled wafer map. FIG. 5D illustrates some embodiments of composite wafer map 500D, wherein the measured wafer map 500B and the modeled wafer map 500C have been combined on a single coordinate grid. However, before utilization of the composite wafer map 500D by the step-and-repeat tool for reticle field 100C patterning, the measured wafer map 500B and the modeled wafer map 500C are refined to minimize disagreement between measured alignment structure locations 502 and modeled alignment structure locations 508.

Figure 6:
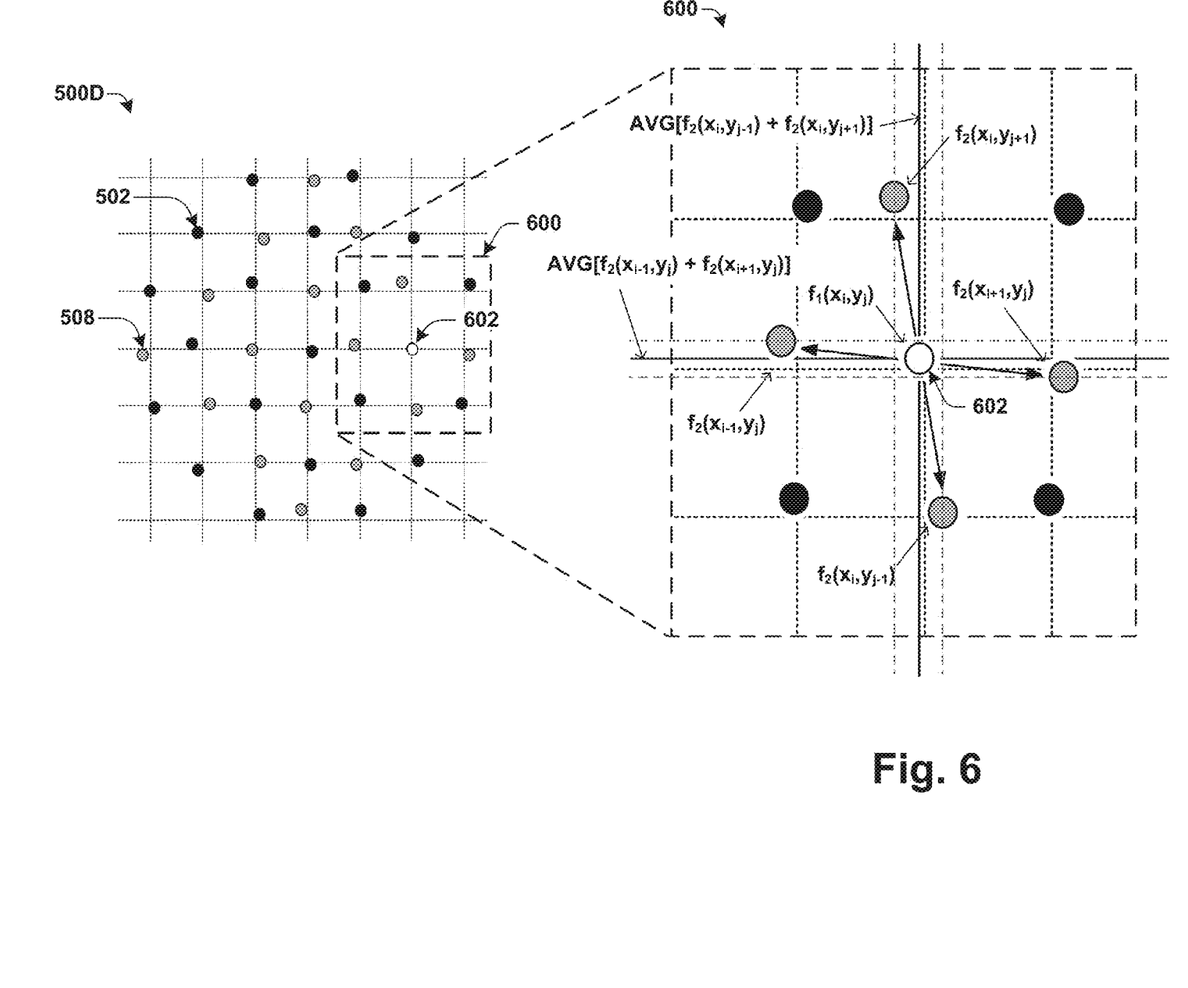
FIG. 6 illustrates some embodiments of stitching a modeled coordinate system to a measured coordinate system.

FIG. 6 illustrates an exploded view 600 of a portion of the embodiments of composite wafer map 500D to illustrate some embodiments of stitching a modeled coordinate system defined by the modeled wafer map 500C to a measured coordinate system defined by the measured wafer map 500B. To minimize disagreement between measured alignment structure locations 502 and the modeled alignment structure locations 508, the two coordinate systems are "stitched" together point-by-point. For instance, a first location 602 defined by the measured coordinate system $f_1(x_i,y_j)$ is adjusted according to the locations of the four nearest-neighbors defined by the modeled coordinate system: $f_2(x_{i-1},y_j)$, $f_2(x_i,y_{j-1})$, $f_2(x_{i+1},y_j)$, and $f_2(x_i,y_{j+1})$, and vice-versa. In some embodiments, the first location 602 is adjusted to locally minimize disagreement between the measured alignment structure locations 502 and the modeled alignment structure locations 508, wherein the first location 602 defined by the measured coordinate system $f_1(x_i,y_j)$ is redefined as an average position of four nearest-neighbor second grid points defined by the modeled wafer map:

$$f_1(x_i,y_j)=\text{AVG}[f_2(x_{i+1},y_j)+f_2(x_{i-1},y_j)+f_2(x_i,y_{j+1})+f_2(x_i,y_{j-1})]. \quad (2)$$

Analogously, a second location defined by the modeled coordinate system $f_2(x_i,y_j)$ but not by the measured wafer coordinate system may redefined as an average position of four nearest-neighbor first grid points defined by the measured wafer coordinate system.

$$f_2(x_k,y_l)=\text{AVG}[f_1(x_{k+1},y_l)+f_1(x_{k-1},y_l)+f_1(x_k,y_{l+1})+f_1(x_k,y_{l-1})]. \quad (3)$$

While these definitions conflict globally, they can be exercised locally by redefining location of a single grid point based upon the locations of its nearest neighbors. Note that while this definition is utilized in the embodiments of FIGS. 5A-5D and FIG. 6 for a checkerboard parsing between the measured alignment structure locations 502 and the modeled alignment structure locations 508, it may generally be employed by stitching of a location defined by a first coordinate system across several nearest-neighbor grid points to location defined by a second coordinate system.

In some embodiments, a first coordinate system is adjusted to globally minimize disagreement between the first coordinate system and a second coordinate system, wherein first locations of grid points of the modeled wafer map are defined as an average of second locations of adjacent grid points which are defined by the measured wafer map, and wherein the second locations of the grid points of the measured wafer map are defined as an average of the first locations of adjacent grid points which are defined by the modeled wafer map. These definitions are then solved recursively by iterating the defined first locations and the defined second locations as functions of one-another until stable first location and second location values are achieved.

$$f(x_i,y_j)=f_1(x_i,y_j)+f_2(x_i,y_j), \text{ where:} \quad (4)$$

$$f_1(x_i,y_j)=\text{AVG}[f_2(x_{i+1},y_j)+f_2(x_{i-1},y_j)+f_2(x_i,y_{j+1})+f_2(x_i,y_{j-1})] \quad (5)$$

$$f_2(x_i,y_j)=\text{AVG}[f_1(x_{i+1},y_j)+f_1(x_{i-1},y_j)+f_1(x_i,y_{j+1})+f_1(x_i,y_{j-1})] \quad (6)$$

In some embodiments, recursively iterating the defined first locations and the defined second locations comprises solving the coupled pair of linear equations (5) and (6) numerically for fixed-point solutions in a computational tool, wherein a set of boundary conditions for the coupled pair of linear equations (5) and (6) comprises a first set of initial grid point values of the modeled wafer map which are not defined by the measured wafer map, and a second set of initial grid point values of the measured wafer map.

Figure 7:
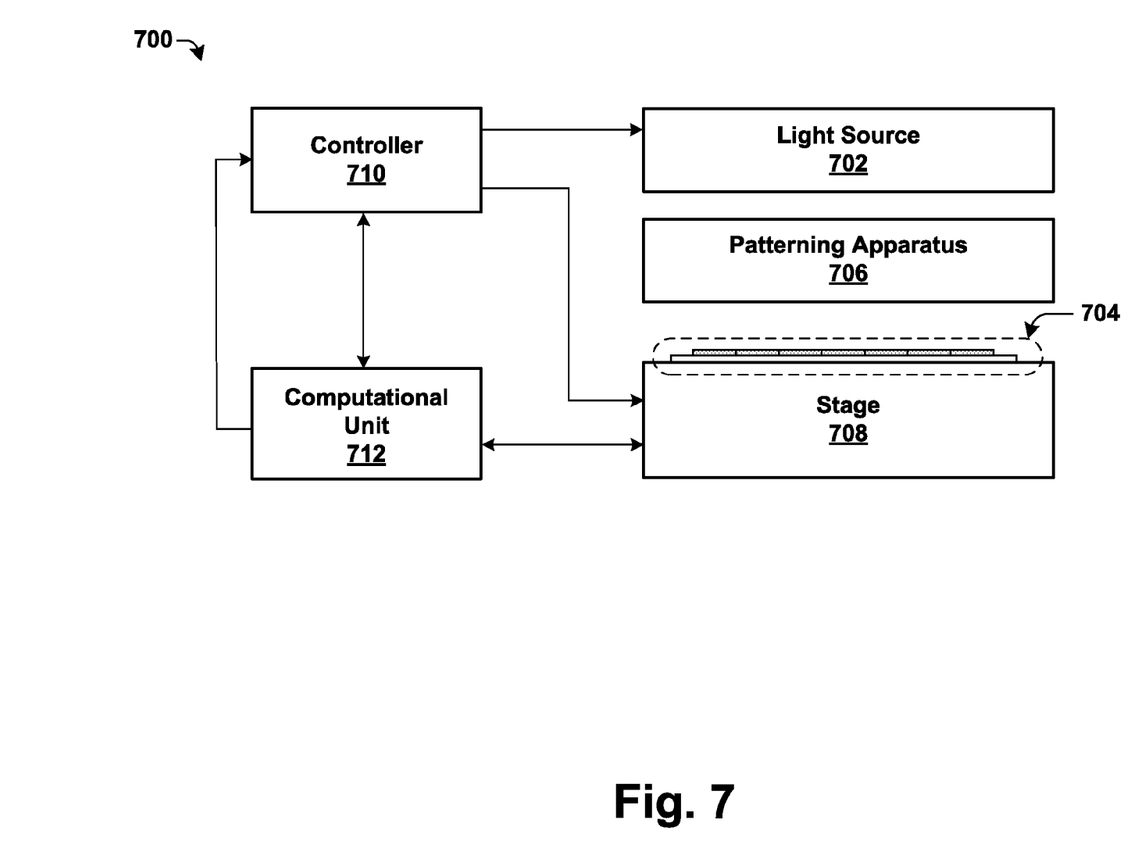
FIG. 7 illustrates some embodiments of a metrology system configured to minimize variation between modeled coordinate positions and measured coordinate positions.

FIG. 7 illustrates some embodiments of a metrology system 700 configured to minimize variation between modeled coordinate positions and measured coordinate positions. The metrology system 700 comprises a light source 702 configured to provide electromagnetic radiation (e.g., light) to a wafer 704 comprising a plurality of alignment structures. The electromagnetic radiation is filtered by a patterning apparatus 706 (e.g., a quartz photomask), wherein the patterning apparatus 706 contains a pattern defined by opaque areas and transparent areas of the patterning apparatus 706, and wherein light passes through the transparent areas to form a pattern of developed photoresist on a surface of the wafer 704. The metrology system 700 further comprises an alignment stage 708 configured to retain the wafer 704 and further configured to measure locations of the plurality of alignment structure to define a measured wafer map. The light source 702 and the alignment stage 708 are controlled by a controller which positions the light source 702 over the wafer 704 for the purpose of alignment structure measurement by the alignment stage 708. The controller 710 is also coupled to a computational unit 712 configured to minimize disagreement between the modeled alignment structure locations and measured alignment structure locations in accordance with the embodiments of FIGS. 5A-5D and FIG. 6.

The computational unit 712 is coupled to the calibration unit 308A or 306B of the embodiments of FIG. 3A or FIG. 3B, respectively. In some embodiments, the computational unit 712 receives $Z(x,y)$ and the layout-based wafer map from the calibration unit 308A or 306B to determine the modeled alignment structure locations and minimize disagreement between the modeled alignment structure locations and measured alignment structure locations. In some embodiments, the modeled wafer map is determined by the calibration unit 308A or 306B and sent to the computational unit 712.

Figure 8:
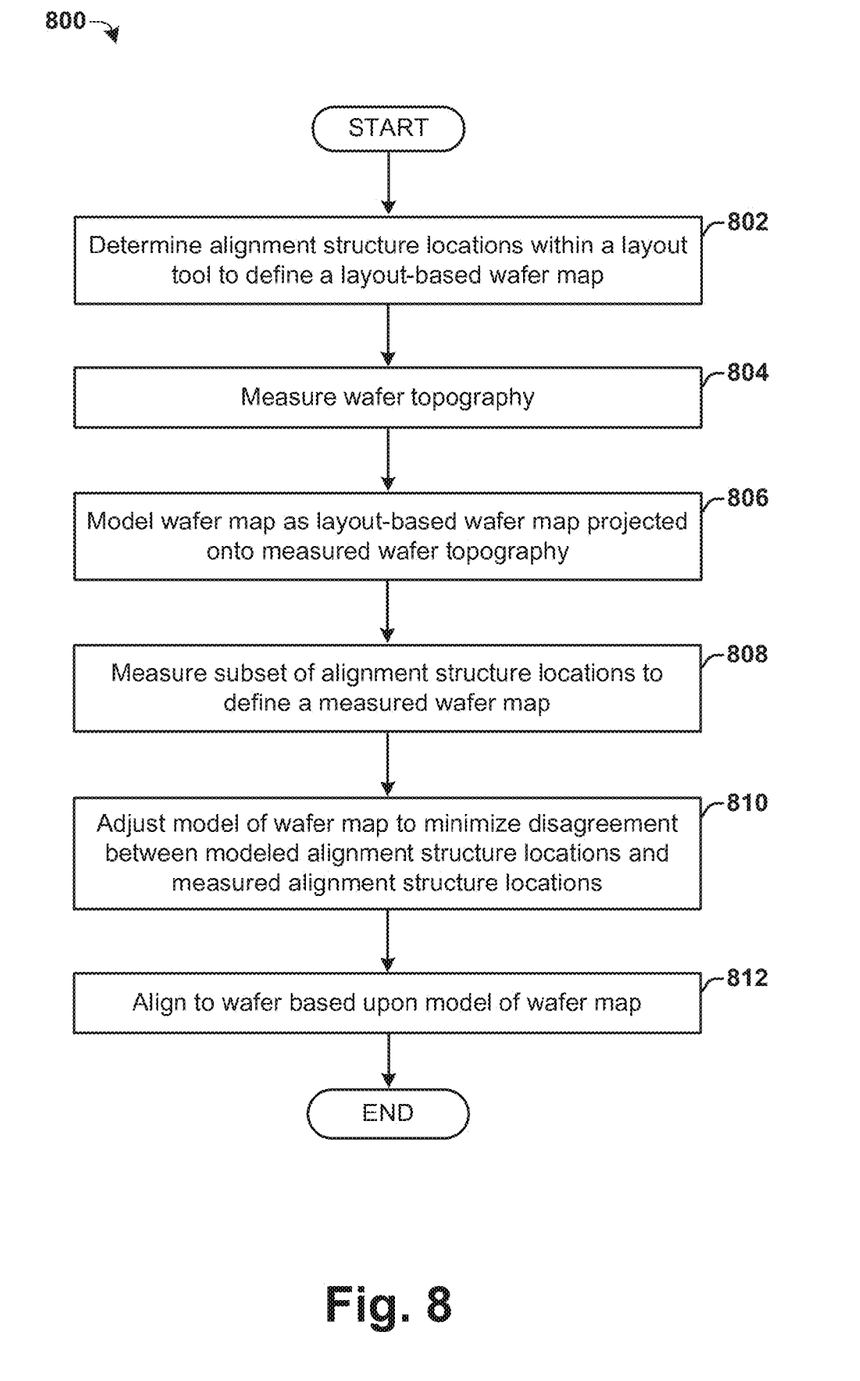
FIGS. 8-9 illustrate some embodiments of methods of wafer alignment.
Figure 9:
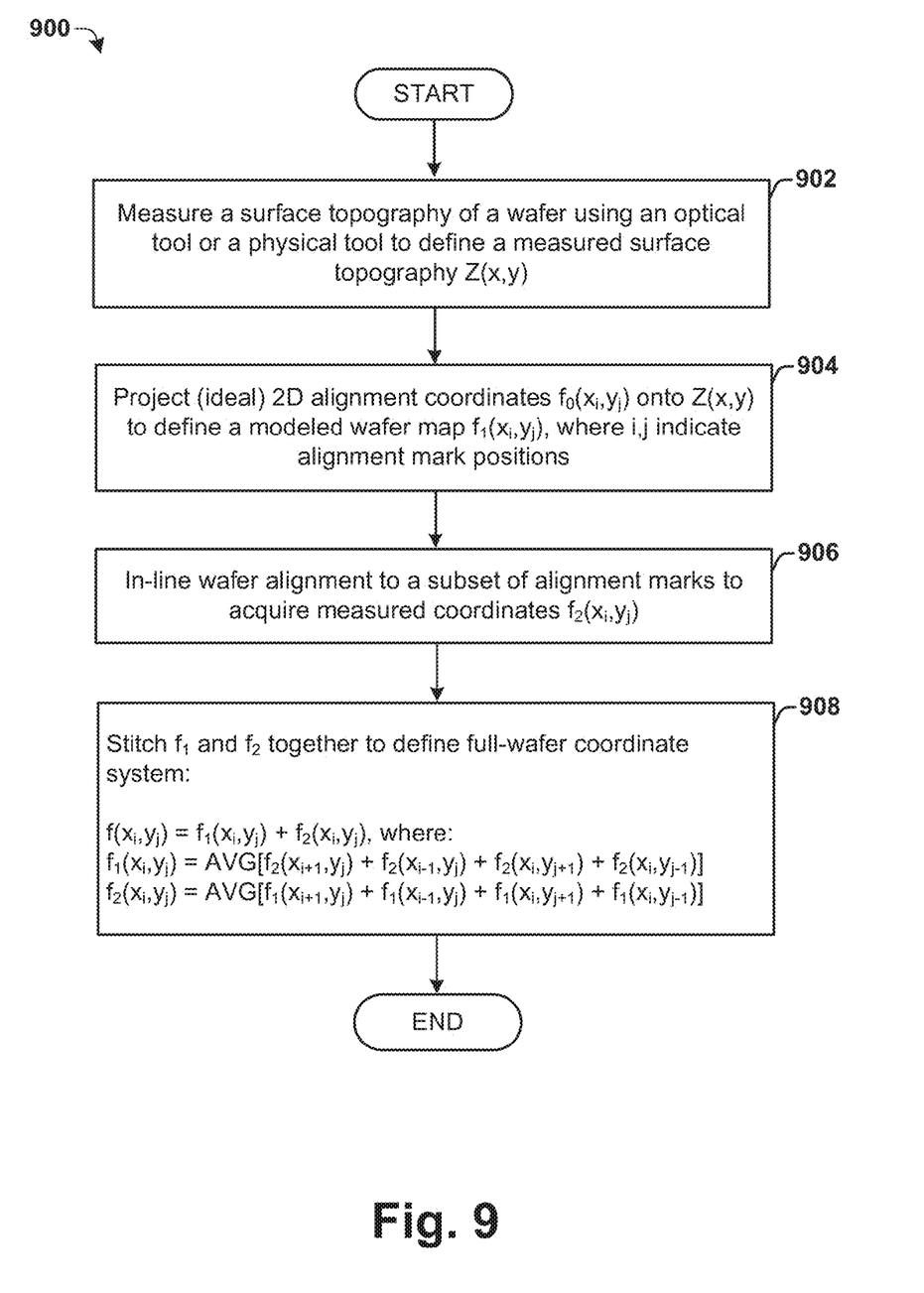

FIGS. 8-9 illustrate some embodiments of methods 800 and 900 of wafer alignment. While the methods 800 and 900 are illustrated and described as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

FIG. 8 illustrates some embodiments of a method 800 of wafer alignment.

At 802 a layout-based wafer map is defined by determining designed locations of a plurality of alignment structures with a layout tool such as a CADENCE VIRTUOSO or MENTOR GRAPHICS design window, wherein one or more ICs are assembled into a wafer-level reticle field comprising one or more alignment structures within each reticle field. In some embodiments, the layout-based wafer map comprises a perfect 2D periodicity, wherein the position of the one or more alignment structures between two respective reticle fields has an identical offset value for any two pairs of reticle fields.

At 804 a surface topography of a wafer is measured as a function of wafer position with a surface measuring tool. In some embodiments, the surface measuring tool measures the surface topology utilizing air pressure variation, wherein a gas is discharged locally onto the wafer surface, a variation in the pressure of the gas is monitored as a function of position, and a height Z of the wafer surface then is determined as a function of the pressure, and transformed to a function of position, $Z(x,y)$. In some embodiments, the surface measuring tool measures the surface topology utilizing electromagnetic radiation, wherein a focused incident beam of light is emitted towards the wafer surface, and is reflected by the wafer surface. The height Z of the wafer surface is determined as a function of position, $Z(x,y)$, from an incident angle or a reflected angle with a normal vector to the wafer surface.

At 806 a modeled wafer map comprising modeled alignment structure locations is defined by projecting the layout-based wafer map onto the measured surface topography within a computational tool.

At 808 a measured wafer map comprising measured alignment structure locations is defined by measuring a subset of alignment structure locations on the wafer with an alignment tool.

At 810 the measured wafer map and the modeled wafer map are adjusted to minimize disagreement between the measured alignment structure locations and the modeled alignment structure locations. In some embodiments, the adjustment occurs locally, wherein a single grid point of a first map (i.e., the measured wafer map or the modeled wafer map, respectively) is determined as an average of adjacent grid points of a second map (i.e., the modeled wafer map or the measured wafer map, respectively). In some embodiments, the adjustment occurs globally, wherein first locations defined by the modeled wafer map are defined as averages of adjacent second locations defined by the measured wafer map, and vice-versa, to define a coupled pair of recursive linear equations which are solved by iterating under a set of convergent boundary conditions until stable first location values and stable second location values are achieved. The stable solutions within the measured wafer map and the modeled wafer map are then combined to form a composite wafer map.

At 812 the composite wafer map is utilized by a step-and-repeat tool to align an exposure stage to the wafer.

FIG. 9 illustrates some embodiments of a method 900 of wafer alignment.

At 902 a surface topography of a wafer is measured to a first resolution with an optical tool or a physical tool to define a measured surface topography height as a function of position, $Z(x,y)$. In some embodiments, the surface topography is measured in-line during an automated fabrication flow within a semiconductor fab. In some embodiments, the surface topography is measured off-line prior to the automated fabrication flow, and the surface topography $Z(x,y)$ is stored and referenced against the wafer identification number for future use in-line.

At 904 a modeled wafer map $f_1(x_i,y_j)$ is defined by projecting a layout-based wafer map $f_0(x_i,y_j)$ onto the measured surface topography $Z(x,y)$, wherein the layout-based wafer map $f_0(x_i,y_j)$ comprises designed locations of a plurality of alignment structures as defined in a layout tool.

At 906 a measured wafer map $f_2(x_i,y_j)$ is defined by measuring a subset of alignment structure locations to a second resolution in-line with an alignment tool, wherein the second resolution is less than the first resolution.

At 908 the modeled wafer map $f_1(x_i,y_j)$ and the measured wafer map $f_2(x_i,y_j)$ are combined to define a full wafer map. In some embodiments, the modeled wafer map $f_1(x_i,y_j)$ and the measured wafer map $f_2(x_i,y_j)$ are defined as a coupled pair of linear equations and solved for stable fixed-point solutions comprising the full wafer map by recursively iterating defined first locations of the modeled wafer map $f_1(x_i,y_j)$ and defined second locations of the measured wafer map $f_2(x_i,y_j)$ in a computational tool. In some embodiments, the stable fixed-point solutions are achieved with a set of boundary conditions comprising a first set of initial grid point values of the modeled wafer map (i.e., the modeled alignment structure locations) which are not defined by the measured wafer map (i.e., the measured alignment structure locations), and a second set of initial grid point values of the measured wafer map (i.e., the measured alignment structure locations).

Therefore, it will be appreciated that the present disclosure relates to a method and system to achieve enhanced overlay control while maintaining manufacturing throughput for a fabrication process. Locations of a plurality of alignment structures on a wafer comprising a plurality of reticle fields are determined with a layout tool to define a layout-based wafer map. The topography of the wafer is then measured as a function of wafer position by a surface measuring tool. The layout-based wafer map is then projected onto the measured wafer topography to define a modeled wafer map. A subset of alignment structure locations are measured with an alignment tool in an in-line fabrication flow so as not to delay subsequent fabrication steps. Disagreement between the measured alignment structure locations and modeled alignment structure locations is then minimized mathematically to enhance overlay control while maintaining manufacturing throughput.

Other embodiments relate to a method of wafer alignment, comprising measuring a surface topography of a wafer to a first resolution with an optical tool or a physical tool, and defining a modeled wafer map by projecting a layout-based wafer map onto the measured surface topography, wherein the layout-based wafer map comprises designed locations of a plurality of alignment structures as defined in a layout tool. A measured wafer map is defined by measuring a subset of alignment structure locations to a second resolution with an alignment tool, wherein the second resolution is less than the first resolution, and the measured wafer map and the modeled wafer map are combined (i.e., overlayed upon one another) to define a full wafer map.

Other embodiments relate to a metrology system comprising a light source configured to provide electromagnetic radiation to a wafer comprising a plurality of alignment structures, wherein the electromagnetic radiation is filtered by a patterning apparatus. The metrology system further comprises an alignment stage configured to retain the wafer and further configured to measure locations of the plurality of alignment structure to define a measured wafer map, and a computational unit configured to minimize disagreement between the modeled alignment structure locations and measured alignment structure locations.

Although the disclosure has been shown and described with respect to a certain aspect or various aspects, equivalent alterations and modifications will occur to others of ordinary skill in the art upon reading and understanding this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the disclosure. In addition, while a particular feature of the disclosure may have been disclosed with respect to only one of several aspects of the disclosure, such feature may be combined with one or more other features of the other aspects as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method of wafer alignment, comprising:
    defining a layout-based wafer map by determining designed locations of a plurality of alignment structures with a layout tool;
    obtaining a measured surface topography of a wafer surface of a wafer as a function of wafer position with a surface measuring tool;
    defining a modeled wafer map comprising modeled alignment structure locations by projecting the layout-based wafer map onto the measured surface topography;
    defining a measured wafer map comprising measured alignment structure locations by measuring a subset of alignment structure locations on the wafer with an alignment tool; and
    adjusting the measured wafer map and the modeled wafer map to minimize disagreement between the measured alignment structure locations and the modeled alignment structure locations.

2. The method of claim 1, wherein the measured surface topography is measured utilizing air pressure variation, wherein:
    a gas is discharged locally onto the wafer surface;
    a variation in the pressure of the gas is monitored as a function of position; and
    determining a height of the wafer surface as a function of the pressure.

3. The method of claim 1, wherein the measured surface topography is measured utilizing electromagnetic radiation, comprising:
    emitting a focused incident beam of radiation to the wafer surface, wherein the incident beam of radiation forms a first angle with a normal vector to the wafer surface;
    reflecting the incident beam of radiation off the wafer surface, resulting in a reflected beam of radiation, wherein the reflected beam of radiation forms a second angle with the normal vector to the wafer surface; and
    determining a height of the wafer surface as a function of position from the first angle or the second angle.

4. The method of claim 1, wherein the measured surface topography is measured with a first resolution that is greater than a second resolution of spacing of the alignment structure locations.

5. The method of claim 1, wherein projecting the layout-based wafer map onto the measured surface topography comprises:
approximating the measured surface topography as having negligible curvature in a local region of a first alignment structure determined from the layout-based wafer map; and
performing a linear projection of the local region onto a flat two-dimensional surface parallel to a plane of the wafer;
wherein the local region is defined as an approximate space between a first alignment structure position determined by the layout-based wafer map and a second alignment structure position determined from the linear projection.

6. The method of claim 1, wherein minimization of the disagreement between the measured alignment structure locations and the modeled alignment structure locations comprises:
determining a first location of a first grid point not defined by the measured wafer map as an average of second locations of adjacent grid points which are defined by the measured wafer map; or
redefining a third location of a second grid point defined by the modeled wafer map as an average of fourth locations of adjacent grid points which are defined by the measured wafer map.

7. The method of claim 1, wherein minimization of the disagreement between the measured alignment structure locations and the modeled alignment structure locations comprises:
defining first locations of grid points of the modeled wafer map as an average of second locations of adjacent grid points which are defined by the measured wafer map;
defining second locations of grid points of the measured wafer map as an average of the first locations of adjacent grid points which are defined by the modeled wafer map; and
recursively iterating defined first locations and defined second locations as functions of one-another until stable first location and second location values are achieved.

8. A method of wafer alignment, comprising:
measuring a surface topography of a wafer surface of a wafer to a first resolution with an optical tool or a physical tool;
defining a modeled wafer map by projecting a layout-based wafer map onto a measured surface topography, wherein the layout-based wafer map comprises designed locations of a plurality of alignment structures as defined in a layout tool;
defining a measured wafer map by measuring a subset of alignment structure locations to a second resolution with an alignment tool, wherein the second resolution is less than the first resolution; and
combining the measured wafer map and the modeled wafer map to define a full wafer map.

9. The method of claim 8, wherein projecting the layout-based wafer map onto the measured surface topography comprises:
approximating the measured surface topography as having negligible curvature in a local region of a first alignment structure determined from the layout-based wafer map; and
performing a linear projection of the local region onto a flat two-dimensional surface parallel to a plane of the wafer;
wherein the local region is defined as an approximate space between an alignment structure position determined by the layout-based wafer map and a second alignment structure position determined from the linear projection.

10. The method of claim 8, wherein the surface topography is measured utilizing air pressure variation, wherein:
a gas is discharged locally onto the wafer surface; and
a variation in the pressure of the gas is monitored as a function of position; and
determining a height of the wafer surface as a function of the pressure.

11. The method of claim 8, wherein the surface topography is measured utilizing electromagnetic radiation, comprising:
emitting a focused incident beam of radiation to the wafer surface, wherein the incident beam of radiation forms a first angle with a normal vector to the wafer surface;
reflecting the incident beam of radiation off the wafer surface, resulting in a reflected beam of radiation, wherein the reflected beam of radiation forms a second angle with the normal vector to the wafer surface; and
determining a height of the wafer surface as a function of position from the first angle or the second angle.

12. The method of claim 8, wherein the subset of alignment structure locations comprise a checkerboard pattern, and wherein at least one alignment structure location within every other reticle of the wafer is measured.

13. The method of claim 12, wherein combining the measured wafer map and the modeled wafer map comprises:
redefining a first location of a first grid point defined by the measured wafer map as an average position of four nearest-neighbor second grid points defined by the modeled wafer map; and
redefining a second location of a second grid point defined by the modeled wafer map but not by the measured wafer map as an average position of four nearest-neighbor first grid points defined by the measured wafer map.

14. The method of claim 12, wherein combining the measured wafer map and the modeled wafer map comprises:
defining first locations of grid points of the modeled wafer map as an average of second locations of adjacent grid points which are defined by the measured wafer map;
defining second locations of grid points of the measured wafer map as an average of the first locations of adjacent grid points which are defined by the modeled wafer map; and
recursively iterating defined first locations and defined second locations as functions of one-another until stable first location and second location values are achieved.

15. The method of claim 14, wherein recursively iterating the defined first locations and the defined second locations comprises solving a coupled pair of linear equations numerically for fixed-point solutions in a computational tool, and wherein a set of boundary conditions for the coupled pair of linear equations comprises a first set of initial grid point values of the modeled wafer map which are not defined by the measured wafer map, and a second set of initial grid point values of the measured wafer map.

16. A metrology system, comprising:
a light source configured to provide electromagnetic radiation to a wafer comprising a plurality of alignment structures, wherein the electromagnetic radiation is filtered by a patterning apparatus;

an alignment stage configured to retain the wafer and further configured to measure locations of the plurality of alignment structures to define a measured wafer map; and a computational unit configured to minimize disagreement between modeled alignment structure locations and measured alignment structure locations.

17. The metrology system of claim 16, further comprising a physical measurement tool configured to measure a surface topography of the wafer, comprising:

an air gauge configured to discharge a gas locally onto a wafer surface, the air gauge further comprising a sensor configured to detect a variation in a pressure of the gas as a function of position;

a positioning apparatus configured to move the air gauge and sensor across the wafer surface; and a calibration unit coupled to the positioning apparatus and configured to determine a height of the wafer surface as a function of the variation in pressure, wherein the calibration unit is coupled to the computational unit.

18. The metrology system of claim 16, further comprising an optical measurement tool configured to measure a surface topography of the wafer, comprising:

an emitter configured to emit a focused incident beam of radiation to a wafer surface at a first angle with a normal vector to the wafer surface;

a collector configured to receive a reflected beam of radiation from the wafer surface at a second angle with the normal vector to the wafer surface, wherein the reflected beam comprises a reflected incident beam; and a calibration unit configured to determine a height of the wafer surface as a function of position from the first angle or the second angle, wherein the calibration unit is coupled to the computational unit.

19. The metrology system of claim 16, wherein the computational unit is further configured to:

redefine a first location of a first grid point defined by the measured wafer map as an average position of four nearest-neighbor second grid points defined by a modeled wafer map; and redefine a second location of a second grid point defined by the modeled wafer map but not by the measured wafer map as an average position of four nearest-neighbor first grid points defined by the measured wafer map.

20. The metrology system of claim 19, wherein the computational unit is further configured to:

define first locations of grid points of the modeled wafer map as an average of second locations of adjacent grid points which are defined by the measured wafer map;

define the second locations of adjacent grid points of the measured wafer map as an average of the first locations of grid points which are defined by the modeled wafer map; and recursively iterate defined first locations and defined second locations as functions of one-another until stable first location and second location values are achieved.

* * * * *